(12) United States Patent
Chang et al.

(10) Patent No.: US 10,222,562 B1
(45) Date of Patent: Mar. 5, 2019

(54) FLEXIBLE CONNECTOR INTERFACE

(71) Applicant: QUANTA COMPUTER INC., Taoyuan (TW)

(72) Inventors: Hou-Hsien Chang, Taoyuan (TW); Chao-Jung Chen, Taoyuan (TW); Yaw-Tzorng Tsorng, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/697,768

(22) Filed: Sep. 7, 2017

(51) Int. Cl.
| | |
|---|---|
| *H01R 13/60* | (2006.01) |
| *G02B 6/38* | (2006.01) |
| *H01R 27/02* | (2006.01) |
| *H01R 13/518* | (2006.01) |
| *G02B 6/44* | (2006.01) |
| *H01R 31/06* | (2006.01) |
| *H01R 12/71* | (2011.01) |
| *H05K 1/14* | (2006.01) |

(52) U.S. Cl.
CPC ......... *G02B 6/3897* (2013.01); *G02B 6/3825* (2013.01); *G02B 6/3879* (2013.01); *G02B 6/3887* (2013.01); *G02B 6/4441* (2013.01); *G02B 6/4471* (2013.01); *H01R 13/518* (2013.01); *H01R 27/02* (2013.01); *H01R 31/065* (2013.01); *G02B 6/3885* (2013.01); *H01R 12/716* (2013.01); *H04Q 2201/802* (2013.01); *H05K 1/141* (2013.01)

(58) Field of Classification Search
CPC ............................ H01R 13/518; H01R 13/659
USPC ............................................. 439/540.1, 713
See application file for complete search history.

(56) References Cited

U.S. PATENT DOCUMENTS

| | | | |
|---|---|---|---|
| 9,632,272 B2 | 4/2017 | Barry et al. | |
| 2005/0191901 A1* | 9/2005 | Follingstad | .......... H01R 13/518 439/534 |
| 2008/0176445 A1* | 7/2008 | Shifris | .................. H01R 9/2416 439/540.1 |

FOREIGN PATENT DOCUMENTS

TW             346691 B        12/1998

OTHER PUBLICATIONS

TW Office Action for Application No. 106142789, dated Nov. 28, 2018, w/ First Office Action Summary.
TW Search Report for Application No. 106142789, dated Nov. 28, 2018, w/ First Office Action.

* cited by examiner

*Primary Examiner* — Phuong K Dinh
(74) *Attorney, Agent, or Firm* — Nixon Peabody LLP; Zhou Lu

(57) ABSTRACT

A connector panel allowing the use of different connector ports in proximity to each other is disclosed. The connector panel has a first type of connector port, such as an optical connector port. An articulated assembly is located adjacent the first type of connector port, and includes a second type of connector port. The articulated assembly may be swung out from the connector panel, thereby allowing for a connector to be inserted or removed from the second type of connector port without interference from the first type of connector port.

15 Claims, 3 Drawing Sheets

FLEXIBLE CONNECTOR INTERFACE

TECHNICAL FIELD

The present disclosure relates generally to a compact connector panel that allows access to connectors. More particularly, aspects of this disclosure relate to using a movable panel to allow for compact and efficient placement of different connector types.

BACKGROUND

Distributed network systems have been widely adopted with the emergence of the cloud for computing applications. Network systems are primarily directed toward the exchange and storage of data between different devices. Network devices that are parts of network systems include servers, switches and other components that must each be capable of receiving different data signals and control signals to properly perform network functions. A wide variety of connectors has emerged for connecting different types of cables carrying electronic signals. Connectors may vary in physical configuration, type of connecting devices, number of conducting connectors and other features. For example, a male connector may have a variable number of pins that carry electrical signals that may be mated with a socket or port with corresponding electrical contacts. In order to allow maximum connectivity to different devices, network devices must have different types of connector ports that will allow different types of connectors to be connected. For example, a network device such as a network server will typically include a USB connector that fits a variety of small micro devices, RJ-45 connectors that allow ten-pin connections associated with Ethernet cables, and video connectors associated with video connectors, etc.

Recently, the demand for increased network capability has led to the incorporation of optical fiber, which can carry greater amounts of data at higher speeds than traditional wired cables. The incorporation of optical connectors allows network devices such as network switches to operate at higher data transmission rates. Optical fiber requires a type of specialized connector distinct from traditional electrical connectors since connectors must include circuits to convert light signals into electrical signals. However, network devices that read optical signals from optical connectors must still incorporate a number of older electrical connection ports for receiving signals communicated through more traditional electrical cables.

The incorporation of optical connectors has created sizing problems in the relatively uniform height of standard network device housings. FIG. 1A shows a prior art connector panel of a network device 10 having a number of optical connector ports 12 that allow connection of optical cables. The optical connector ports 12 in this example are incorporated on a back panel 14. As may be seen in FIG. 1A, the optical connector ports 12 include a rectangular transceiver plug, a cylindrical transceiver and a transceiver tag and thus occupy a significant area of the back panel 14 and extend outward from the back panel 14. The area above the optical connector ports 12 includes space for traditional 10 pin RJ-45 connector ports 16 used for electrical wires. Other electrical connector ports may also be located in the area above the optical connector ports 12. FIG. 1A shows an RJ-45 type connector 18 inserted into the connector port 16. The RJ-45 connector 18 is a type of phone based physical connector having a number of conductor slots that mate with corresponding conductors in a connector port such as the connector port 16. The RJ-45 connector 18 includes a flexible latch 20 that extends out from the front of the body of the connector 18. The end of the latch 20 may be compressed to release the RJ-45 connector 18 from the connector port 16. As may be seen in FIG. 1A, one arrangement orients the latch 20 in a slot 22 at the top of the connector 18. This configuration suffers from adding some additional height to the panel 14 as well as making it difficult to access the latch 20, because it is potentially flush against another piece of equipment stacked on the network device 10. As such it is difficult to disconnect the RJ-45 connector 18 from the connector port 16.

Another alternative arrangement of optical fiber connector ports and wire connector ports may be seen in another example network device 50 in FIG. 1B. Like elements in FIG. 1A such as the optical fiber ports 12, the RJ-45 connector port 16 and the RJ-45 connector 18 are labeled identically in FIG. 1B. In the device 50, the RJ-45 connector 18 has been oriented so the latch 20 is distal from the edge of the panel 14. This allows the network device 50 to be more compact in height. However, as may be seen in FIG. 1B, the latch 20 is difficult to access since it is in close proximity to the optical connection ports 12. Further, the latch 20 is also difficult to pull down to release the RJ-45 connector 18 since the optical connection ports 12 are immediately below the latch 20 and block the movement of the latch 20.

Thus, there is a need for a connector panel that allows the easy connection and disconnection of a latch based connector. There is also a need for a connector panel that includes optical connector ports and standard electrical connector ports. There is also a need for a connector panel that minimizes height but allows for different types of connector ports.

SUMMARY

One disclosed example is a network device including a casing and a connector panel on one end of the casing. The connector panel has a first connector port. An articulated assembly is in proximity to the first connector port. The articulated assembly has a second connector port. The articulated assembly can swing between a first position flush with the connector panel and a second position away from the connector panel.

Another example is a connector panel allowing the connection of cables to a network device. The panel has a first area including a first connector port. The panel has a second area including an articulating assembly operable to swing between a first position flush, with the first area and a second position away from the second area. The second area is proximate to the first area. The articulating assembly includes a second connector port.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1A:
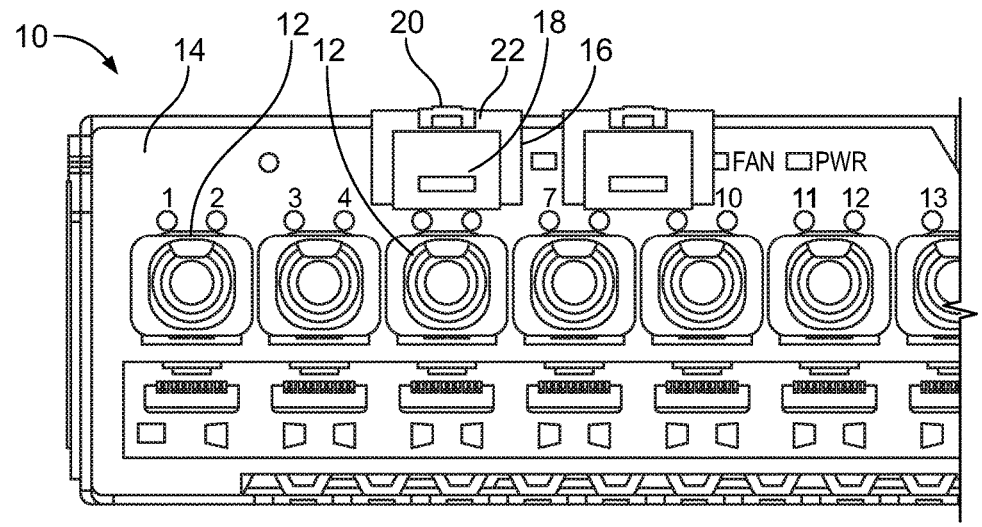
FIG. 1A is a prior art connector panel including optical connector ports and electrical connector ports in one orientation.
Figure 1B:
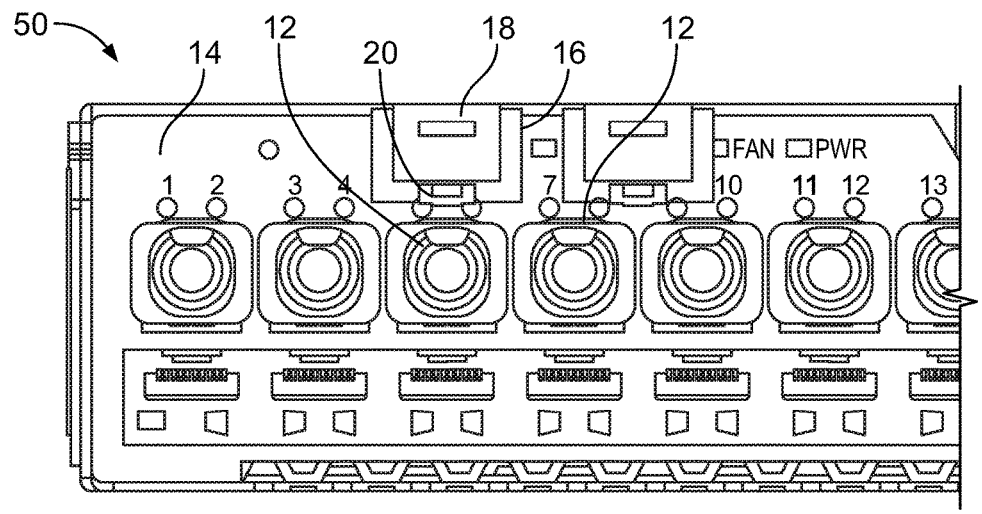
FIG. 1B is another prior art connector panel including optical connector ports and electrical connector ports in an opposite orientation from that in FIG. 1A.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is intended to cover all modifications, equivalents, and alternatives falling within the spirit and scope of the invention as defined by the appended claims.

DETAILED DESCRIPTION OF THE ILLUSTRATED EMBODIMENTS

The present inventions can be embodied in many different forms. Representative embodiments are shown in the drawings, and will herein be described in detail, with the understanding that the present disclosure is an example or illustration of the principles of the present disclosure and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed: the singular includes the plural and vice versa; and the word "including" means "including without limitation." Moreover, words of approximation, such as "about," "almost," "substantially," "approximately," and the like, can be used herein to mean "at, near, or nearly at," or "within 3-5% of," or "within acceptable manufacturing tolerances," or any logical combination thereof, for example.

Figure 2:
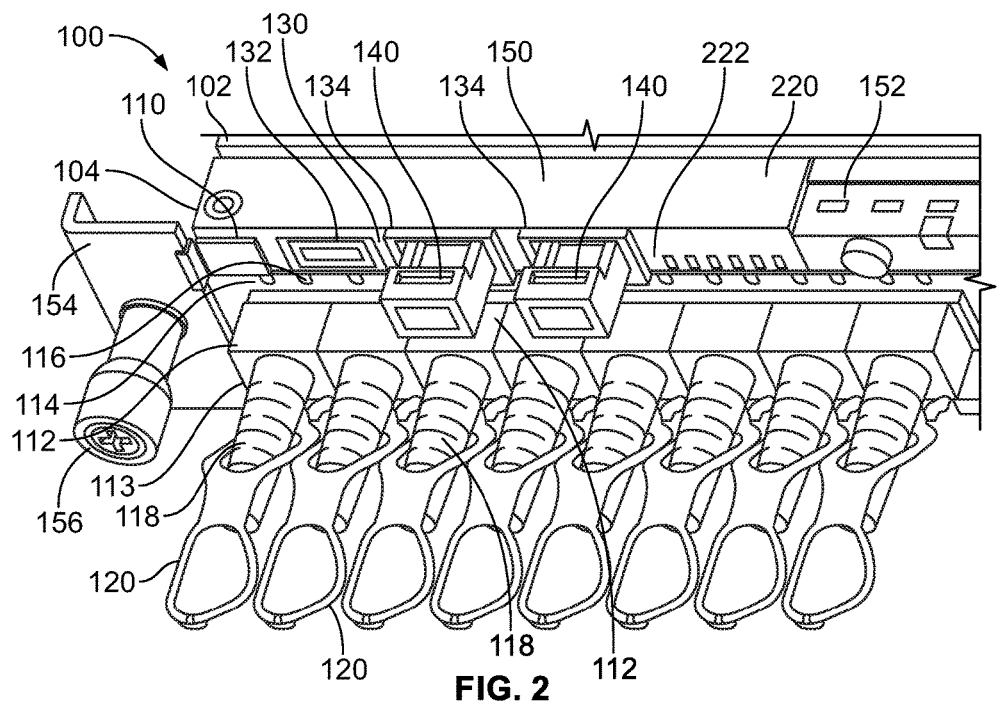
FIG. 2 is a perspective view of a connector panel having optical connector ports and electrical connector ports on an articulated assembly.

FIG. 2 shows an example device with a variety of connector ports such as a network switch device 100 that is used to transfer data signals between different network nodes. In FIG. 2, the network switch device 100 includes a casing 102 that includes a back end 104 that has interface hardware for a variety of connector ports to allow for connection to other network nodes and devices via different types of connector cables.

The back end 104 includes a connector panel 110 that includes a series of optical connector ports 112. As shown in FIG. 2, each of the optical connector ports 112 has a rectangular transceiver plug 113 extending outward from the connector panel 110. The rectangular body contains cladding material to receive an optical signal from optical fiber and mechanical and electrical components to convert the light signal on the optical fiber into an electrical signal. Each of the optical connector ports 112 are in proximity to two LEDs 114 and 116 that indicate connections and transmissions on the optical connector port 112. In this example, each of the optical connector ports 112 are mated with an optical transceiver 118 that includes a transceiver tag 120, which holds the optical cable to the respective optical connector port 112. The transceiver tag 120 orients the optical cable to insure that the optical cable does not kink and therefore degrade the optical signal. Of course it is understood that depending on the network configuration desired, less than all of the optical connector ports 112 may have optical transceivers 118 plugged in. Thus, certain optical connector ports 112 may be open ports that do not have connected optical connectors.

The connector panel 110 includes an area 130 above the optical connector ports 112 for additional electrical connector ports. In this example, the area 130 includes a USB connector port 132 and two RJ-45 connector ports 134. Although two RJ-45 connector ports 134 are shown in this example, it is understood that any number of RJ-45 connector ports 134 may be provided on the connector panel 110. In addition, other types of connector ports may be located in the area 130. The RJ-45 connector ports 134 and the USB connector port 132 are on an articulated assembly 150. FIG. 2 shows RJ-45 connectors 140 inserted in the RJ-45 connector ports 134. As may be seen in FIG. 2, the connector ports 134 are in close proximity to the optical connector ports 112. The optical connector ports 112 and the inserted optical transceivers 118 thus impede ready access to the connector ports 134.

Figure 3:
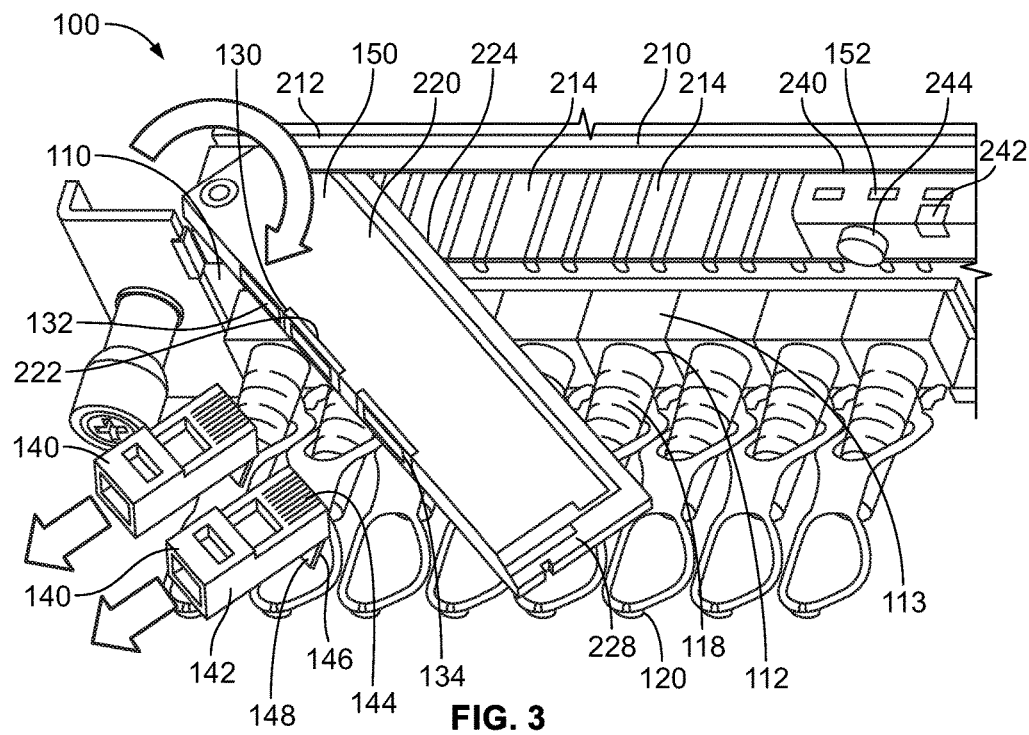
FIG. 3 is a perspective view of the connector panel in FIG. 2 with the articulated assembly swung out.

As shown in FIGS. 2-3, the RJ-45 connectors 140 have a rectangular body 142 with a top side having a connection area 144 with ten wires in slots that are cut out on the front end of the body. The back end of the body 140 includes a socket to hold an electrical cable. A flexible latch 146 is held by the front end of the body 142 opposite the connection area 144. The flexible latch 146 has a free end 148 opposite the front end of the body 142. When the free end 148 of the flexible latch 146 is compressed, the RJ-45 connectors 140 may be released from the RJ-45 connector port 134.

Figure 4:
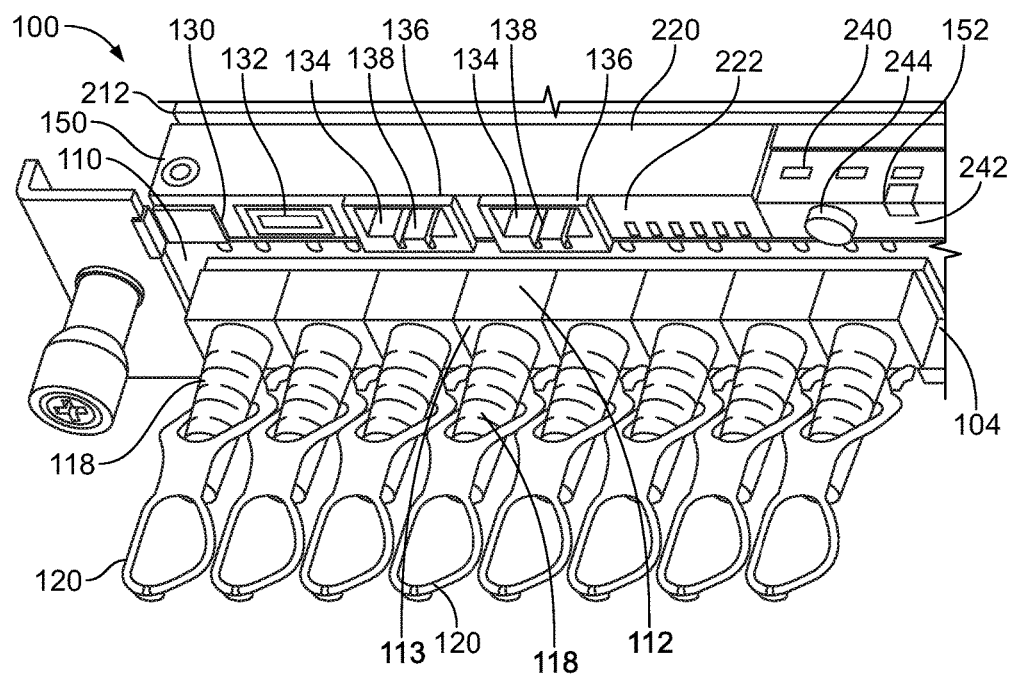
FIG. 4 is a perspective view of the connector panel in FIG. 2 with the articulated assembly reattached to the connector panel.

FIG. 4 shows the RJ-45 connector port 134 with the RJ-45 connector removed. The RJ-34 connector port 134 includes a frame member 136. In this example, the top interior wall of the RJ-34 connector port 134 includes wire contacts to mate with the slots of the connection area 144 in the RJ-45 connector 140 in FIG. 3. The frame member 136 includes a slot 138 at the bottom to allow the latch 146 of the RJ-45 connector to be inserted as shown in FIG. 3.

As shown in FIG. 2, the articulated connector assembly 150 normally is in a closed position flush against the connector panel 110 when the RJ-45 connectors 140 are inserted in the RJ-45 connector ports 134. A sliding latch assembly 152 is adjacent to the articulated connector assembly 150 to hold the articulated connector assembly 150 in the closed position. A support member 154 supports the connector panel 110. A pin 156 is inserted through the support member 154 and holds the connector panel 110 on the device 100. The connector panel 110 has a relatively compact height because of the close proximity of the connector ports 134 to the optical connector ports 112, but allows both electrical cables and optical cables to be connected to the respective optical and electrical connector ports 112 and 134.

FIG. 3 shows the articulated assembly 150 swung away from the connector panel 110 to allow a user to connect and disconnect an RJ-45 connector such as the connectors 140 to and from the RJ-45 connector port 134. As shown in FIG. 3, the connector panel 110 includes a heat sink 210 that holds a pivot point 212 that is connected to the articulated assembly 150. The articulated assembly 150 may thus be rotated away from the connector panel 110 around the pivot point 212. Various wires (not shown) are connected to the back of the area 130 to the connector ports 132 and 134. The wires are of sufficient length to allow connection of the connector ports 132 and 134 to other hardware in the network switch 100 when the articulated assembly 150 is rotated away from the connector panel 110. As may be seen in FIG. 3, a series of light pipes 214 are connected to each of the transceiver plugs 113.

As shown in FIG. 3, the articulated assembly 150 includes a top panel 220 and a front panel 222 connected at a perpendicular angle to the top panel 220. A middle flap 224 extends from the back of the front panel 222 and is parallel to the top panel 220. The middle flap 224 and the top panel 220 together form a slot that fits the edge of the heat sink 210 when the articulated assembly 150 is in a closed position as shown in FIGS. 2 and 4. As shown in FIGS. 2-4, the front panel 222 is sized to be flush on the connector panel 110 to form the area 130 above the optical connector ports 112.

As shown in FIG. 3, the latch assembly 152 includes a top member 240 and a front member 242 that are joined perpendicularly. The front member 242 holds a pin 244 that mates with a slot (not shown) on the device 100. A spring (not shown) may be installed to force the latch assembly 152 to contact the articulated assembly 150. The latch assembly 152 may therefore be moved between a locked position and an open position relative to the articulated assembly 150. In this example, the middle flap 224 of the latch assembly 152 includes a tab 228 that extends out from the edge of the middle flap 224 when the latch assembly 152 is in the closed position. The edges of the top member 240 and the front member 242 serve to contact tab 228 and the front panel 222 respectively and thereby hold the articulated assembly 150 in the closed position as shown in FIG. 2.

When a user applies pressure to move the latch assembly 152 to the open position as shown in FIG. 3, the articulated assembly 150 is released and may be rotated away from the connector panel 110. As shown in FIG. 3, when the articulated assembly 150 is rotated away from the connector panel 110, the connector ports 134 are no longer directly on top of the optical connector ports 112 and the optical transceivers 118. As shown in FIGS. 3-4, when the articulated assembly 150 is rotated away from the connector panel 110, this allows sufficient space for the latch 146 of the RJ-45 connector 140 to be compressed in an upward direction in the bottom slot 136 thereby easily releasing the connector 140 from the RJ-45 connector port 134 since the optical connector ports 112 and transceivers 118 do not block access to the end 148 of the latch 146. In this manner, the control panel 110 may have a smaller relative height since the slot 138 on the RJ-45 connector port 134 for inserting the latch 142 of the RJ-45 connector 140 may be located at the bottom of the connector port 134. In this example, the connectors 140 are removed from the RJ-45 connector ports 134 on the articulated assembly 150 as shown in FIG. 3.

FIG. 4 shows the articulated assembly 150 after the RJ-45 connectors 140 shown in FIGS. 2-3 have been removed from the RJ-45 connector ports 134. The latch assembly 152 is moved to the open position, and the articulated assembly 150 is moved to the closed position on the connector panel 110. The latch assembly 152 is then released to the closed position to lock in the articulated assembly 150. When the articulated assembly 150 is rotated away from the connector panel 110 as shown in FIG. 3, RJ-45 connectors may be connected to any empty RJ-45 connection ports 134 as well. Once the connectors 140 in FIG. 2-3 are either removed from the ports 134 or inserted in the ports 134, the articulated assembly 150 may be swung back to the position flush with the connector panel 110 as shown in FIG. 4.

The connector panel 110 may have several rows of connectors and may have several articulated assemblies similar to the articulated assembly 150 to allow for a more compact footprint. For example, the connector panel 110 may have articulated assemblies similar to the articulated assembly 150 in proximity to both the top and bottom of the panel, to facilitate the connection of connectors but allowing a more compact arrangement. A number of articulated assemblies, similar to the articulated assembly 150 may be located along the top or the bottom edge of the connector panel 110 for holding additional connector ports. In addition, the connector ports that are fixed on the connector panel 110 may be the same type as the optical connector ports 112 or different types of connectors. The connector ports on the articulated assembly 150 may be all of the same type or different types. An articulated assembly similar to the articulated assembly 150 may be located in proximity to one of the sides of the connector panel 110 if the connector ports are arranged in a vertical orientation.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

Computing devices typically include a variety of media, which can include computer-readable storage media and/or communications media, in which these two terms are used herein differently from one another as follows. Computer-readable storage media can be any available storage media that can be accessed by the computer, is typically of a non-transitory nature, and can include both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

The terminology used herein is for the purpose of describing particular embodiments only, and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore terms, such as those defined in commonly used dictionaries, should be interpreted as having a meaning that is consistent with their meaning in the context of the relevant art and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A network device, comprising: a casing; a connector panel on one end of the casing, the connector panel having a first connector port; an articulated assembly in proximity to the first connector port, the articulated assembly substantially vertically space apart from and having a second connector port, wherein the articulated assembly is operable to swing between a first position flush with the connector panel and a second position away from the connector panel wherein the first and second connector ports and different types of connector ports for receiving different types of mating connectors and a locking assembly having a locked position holding the articulated assembly in the first position, and an open position releasing the articulated assembly.

2. The network device of claim 1, wherein the first connector port is an optical connector port, and wherein the second connector port is a wired connector port.

3. The network device of claim 1, wherein the second connector port includes a slot to receive a latch of a mating connector.

4. The network device of claim 3, wherein the mating connector is an RJ-45 connector.

5. The network device of claim 1, wherein a third connector port is located on the control panel or the articulated assembly.

6. A connector panel allowing the connection of cables to a network device, the panel comprising: a first area including a first connector port; a second area including an articulating assembly substantially vertically space apart from and operable to swing between a first position flush with the first area, and a second position away from the second area, the second area proximate the first area, wherein the articulating assembly includes a second connector port, wherein the first and second connector ports are different types of connector ports for receiving different types of mating connectors and a locking assembly having a locked position holding the articulated assembly in the first position and an open position releasing the articulated assembly.

7. The connector panel of claim 6, wherein the first connector port is an optical connector port extending outwardly from the panel, and wherein the second connector port is a wired connector port.

8. The connector panel of claim 6, wherein the second connector port includes a slot to receive a latch of a mating connector.

9. The connector panel of claim 8, wherein the mating connector is an RJ-45 connector.

10. A network device, comprising: a casing; a connector panel on one end of the casing, the connector panel having a first connector; an articulated assembly in proximity to the first connector port, the articulated assembly substantially vertically space apart from and having a second connector port, wherein the articulated assembly is operable to swing between a first position flush with the connector panel and a second position away from the connector panel wherein, in the second position away from the connector panel a connector is capable of being connected or disconnected from the second connector port, and a locking assembly having a locked position holding the articulated assembly in the first position and an open position releasing the articulated assembly.

11. The network device of claim 10, wherein the first and second connector ports are different types of connector ports for receiving different types of mating connectors.

12. The network device of claim 10, wherein the first connector port is an optical connector port, and wherein the second connector port is a wired connector port.

13. The network device of claim 10, wherein the second connector port includes a slot to receive a latch of a mating connector.

14. The network device of claim 13, wherein the mating connector is an RJ-45 connector.

15. The network device of claim 10, wherein a third connector port is located on the control panel or the articulated assembly.

* * * * *